(12) United States Patent
Koike et al.

(10) Patent No.: US 8,071,211 B2
(45) Date of Patent: Dec. 6, 2011

(54) SURFACE-COATED CUTTING TOOL

(75) Inventors: Sachiko Koike, Itami (JP); Makoto Setoyama, Itami (JP); Hideki Moriguchi, Itmai (JP)

(73) Assignees: Sumitomo Electric Industries, Ltd., Osaka (JP); Sumitomo Electric Hardmetal Corp., Hyogo (JP)

( * ) Notice: Subject to any disclaimer, the term of this patent is extended or adjusted under 35 U.S.C. 154(b) by 407 days.

(21) Appl. No.: 12/303,331

(22) PCT Filed: Jul. 18, 2007

(86) PCT No.: PCT/JP2007/064135
§ 371 (c)(1),
(2), (4) Date: Dec. 3, 2008

(87) PCT Pub. No.: WO2008/041402
PCT Pub. Date: Apr. 10, 2008

(65) Prior Publication Data
US 2009/0202312 A1    Aug. 13, 2009

(30) Foreign Application Priority Data
Oct. 2, 2006    (JP) .................. 2006-271066

(51) Int. Cl.
*B23B 27/14* (2006.01)
(52) U.S. Cl. ............ 428/336; 51/307; 51/309; 428/697; 428/698; 428/699; 428/701; 428/702
(58) Field of Classification Search .............. 51/307, 51/309; 428/336, 697, 698, 699, 701, 702
See application file for complete search history.

(56) References Cited

U.S. PATENT DOCUMENTS

| 5,310,607 | A  | * | 5/1994 | Schulz et al. ............... 428/701 |
| 5,879,823 | A  | * | 3/1999 | Prizzi et al. ................ 428/702 |
| 6,713,172 | B2 | * | 3/2004 | Ljungberg et al. ........... 428/697 |
| 7,273,665 | B2 | * | 9/2007 | Hayahi et al. ............... 428/699 |
| 2001/0024737 | A1 | | 9/2001 | Utsumi et al. |

FOREIGN PATENT DOCUMENTS

| EP | 1 382 709 A1 | | 1/2004 |
| EP | 1 400 293 A2 | | 3/2004 |
| JP | 09-248702 | | 9/1997 |
| JP | 11-246066 | | 9/1999 |
| JP | 2002-053946 | * | 2/2002 |
| JP | 2003-025113 | | 1/2003 |
| JP | 2005-138210 | | 6/2005 |
| JP | 2005-262356 | | 9/2005 |
| JP | 2005-344148 | | 12/2005 |
| JP | 2006-150530 | * | 6/2006 |
| JP | 2006-192545 | | 7/2006 |

OTHER PUBLICATIONS

European Search Report issued in European Patent Application No. EP 07790890.3 dated Jun. 17, 2011.

* cited by examiner

*Primary Examiner* — A. T.
(74) *Attorney, Agent, or Firm* — McDermott Will & Emery LLP (57) ABSTRACT

A surface-coated cutting tool according to the present invention includes a base material and a coating film formed on the base material. The coating film includes one or more hard layer and one or more oxygen-rich hard layer. The hard layer is crystalline in its entirety or crystalline with a part thereof being amorphous. The oxygen-rich hard layer and the hard layer are stacked and the oxygen-rich hard layer is amorphous in a region of interface with the hard layer.

10 Claims, 1 Drawing Sheet

FIG.1

SURFACE-COATED CUTTING TOOL

RELATED APPLICATIONS

This application is the US National Phase under 35 U.S.C. §371 of International Application No. PCT/JP2007/064135, filed on Jul. 18, 2007, which claims the benefit of Japanese Application No. JP 2006-271066, filed on Oct. 2, 2006, the disclosures of which Applications are incorporated by reference herein.

TECHNICAL FIELD

The present invention relates to a surface-coated cutting tool including a coating film on a base material.

BACKGROUND ART

A surface-coated cutting tool including a coating film on a base material has conventionally been used. In such a surface-coated cutting tool, various improvements in the coating film have been made in order to further enhance wear resistance or chipping resistance.

For example, a surface-coated cutting tool in which a hard coating layer composed of titanium nitride or the like and a composite oxide layer composed of Al, Si, and Ti are stacked to implement a coating film formed on a base material has been proposed (Japanese Patent Laying-Open No. 09-248702 (Patent Document 1)). The surface-coated cutting tool has been stated as excellent in chipping resistance even under severe conditions. On the other hand, as the composite oxide layer is formed in an amorphous state, its hardness is poor and further improvement in wear resistance has been required.

Meanwhile, a surface-coated cutting tool in which an inner layer containing a nitride of Ti or the like and an outer layer composed of aluminum oxide are stacked to implement a coating film formed on a base material has been proposed (Japanese Patent Laying-Open No. 2005-138210 (Patent Document 2)). The surface-coated cutting tool has intended to improve chipping resistance by forming a part of the outer layer as amorphous and absorbing external shock there. Expansion of an amorphous region in the outer layer, however, may lead to poorer wear resistance as in Patent Document 1 above. Therefore, it is considered that the amorphous region is preferably limited only to a part of the outer layer and other regions should be crystalline.

If a region other than the amorphous region in the outer layer is formed as crystalline, crystals different in crystal structure come in contact with each other at the interface between the inner layer and the outer layer. Then, adhesion therebetween becomes poor and disadvantage such as separation between layers may be caused. In order to improve adhesion between the layers, it has been necessary to lower compressive stress of the inner layer or to form another intermediate layer. If compressive stress of the inner layer is lowered, sufficient wear resistance is not obtained during high-speed cutting and formation of another intermediate layer lowers manufacturing efficiency.

Patent Document 1: Japanese Patent Laying-Open No. 09-248702
Patent Document 2: Japanese Patent Laying-Open No. 2005-138210

DISCLOSURE OF THE INVENTION

Problems to be Solved by the Invention

The present invention was made in view of the above-described circumstances, and an object of the present invention is to provide a surface-coated cutting tool excellent in adhesion between layers in a coating film formed on a base material and excellent in both wear resistance and chipping resistance.

Means for Solving the Problems

A surface-coated cutting tool according to the present invention includes a base material and a coating film formed on the base material, the coating film includes one or more hard layer and one or more oxygen-rich hard layer, the hard layer is crystalline in its entirety or crystalline with a part thereof being amorphous, and the oxygen-rich hard layer and the hard layer are stacked and the oxygen-rich hard layer is amorphous in a region of interface with the hard layer.

Here, preferably, the oxygen-rich hard layer is crystalline in a region other than the region of interface, and the region of interface is formed to a thickness from at least 1 nm to at most 500 nm from the interface with the hard layer.

In addition, preferably, the hard layer is composed of a compound containing at least one element selected from the group consisting of IVa-group elements (Ti, Zr, Hf, and the like), Va-group elements (V, Nb, Ta, and the like) and VIa-group elements (Cr, Mo, W, and the like) in a periodic table, Al, Mg, and Si, and nitrogen element, or a compound containing at least one element selected from the group consisting of IVa-group elements, Va-group elements and VIa-group elements in a periodic table, Al, Mg, and Si, nitrogen element, and at least one element selected from the group consisting of carbon, oxygen, and boron.

In addition, preferably, the compound containing at least one element selected from the group consisting of IVa-group elements, Va-group elements and Via-group elements in the periodic table, Al, Mg, and Si, nitrogen element, and at least one element selected from the group consisting of carbon, oxygen, and boron has a crystal structure identical to a crystal structure of a compound containing only at least one element selected from the group consisting of IVa-group elements, Va-group elements and VIa-group elements in the periodic table, Al, Mg, and Si and nitrogen element contained in the compound.

In addition, preferably, the oxygen-rich hard layer is composed of a compound containing at least one element selected from the group consisting of IVa-group elements, Va-group elements and VIa-group elements in a periodic table, Al, Y, Mg, B, and Si and oxygen element, or a compound containing at least one element selected from the group consisting of IVa-group elements, Va-group elements and VIa-group elements in a periodic table, Al, Y, Mg, B, and Si, oxygen element, and at least one element selected from the group consisting of carbon, nitrogen, and boron.

In addition, preferably, the compound containing at least one element selected from the group consisting of IVa-group elements, Va-group elements and VIa-group elements in the periodic table, Al, Y, Mg, B, and Si, oxygen element, and at least one element selected from the group consisting of carbon, nitrogen, and boron has a crystal structure identical to a crystal structure of a compound containing only at least one element selected from the group consisting of IVa-group elements, Va-group elements and VIa-group elements in the periodic table, Al, Y, Mg, B, and Si, and oxygen element contained in the compound, in a region other than the region of interface.

Preferably, the compound forming the oxygen-rich hard layer contains Al, and preferably, the compound forming the oxygen-rich hard layer further contains at least one element selected from the group consisting of Zr, Hf, B, Ti, Cr, Y, and Si, together with Al.

In addition, preferably, the coating film has a thickness from at least 0.1 μm to at most 25 μm, and preferably, the base material is formed from any one of cemented carbide, cermet, high-speed steel, ceramics, sintered cubic boron nitride, and sintered diamond.

EFFECTS OF THE INVENTION

With the features above, the surface-coated cutting tool according to the present invention is excellent in adhesion between layers in the coating film formed on the base material and excellent in both wear resistance and chipping resistance.

DESCRIPTION OF THE REFERENCE SIGNS

10 film forming apparatus; 14 holder; 15 gas introduction port; 16 heater; 20 base material; 21, 22, 23, 24 arc evaporation source; and 25 unbalanced magnetron sputtering evaporation source.

BEST MODES FOR CARRYING OUT THE INVENTION

The present invention will be described hereinafter further in detail.

<Surface-Coated Cutting Tool>

The surface-coated cutting tool according to the present invention includes the base material and the coating film formed on the base material. The surface-coated cutting tool according to the present invention having such a structure is extremely useful as a drill, an end mill, a cutting insert with replaceable edge for milling or turning, a metal saw, a gear cutting tool, a reamer, a tap, or an insert for crankshaft pin milling.

<Base Material>

A conventionally known base material for the cutting tool may be used as the base material for the surface-coated cutting tool according to the present invention, without particularly limited. Examples of such a base material include cemented carbide (for example, WC based cemented carbides composed of WC alone or combination of WC and Co and/or carbonitride or the like of Ti, Ta, Nb, or the like), cermet (mainly composed of TiC, TiN, TiCN, or the like), high-speed steel, ceramics (titanium carbide, silicon carbide, silicon nitride, aluminum nitride, aluminum oxide, mixture thereof, or the like), sintered cubic boron nitride, sintered diamond, and the like. In the case of employing the cemented carbide as the base material, the effect of the present invention is obtained even when the cemented carbide contains free carbon or an abnormal phase called η phase in its texture.

The surface of the base material may be reformed. For example, in the case of the cemented carbide, a beta (β) removal layer may be formed on its surface, or in the case of the cermet, a surface-hardened layer may be formed. Even if the surface is reformed in such a manner, the effect of the present invention is still obtained.

<Coating Film>

The coating film formed on the base material of the surface-coated cutting tool according to the present invention is formed by stacking one or more layer. More specifically, the coating film includes one or more hard layer and one or more oxygen-rich hard layer. So long as each such layer is included, other layers may additionally be included. It is noted that the coating film of the present invention is not limited to an example where the entire surface of the base material is coated with the coating film, and an example where a coating film is not partially formed may be encompassed.

The coating film of the present invention achieves high wear resistance and chipping resistance owing to synergistic effect of the layers. Particularly, the hard layer directly contributes to improvement in wear resistance and chipping resistance, while the oxygen-rich hard layer contributes to improvement in oxidation resistance and stability at high temperature, to thereby indirectly support achievement of both wear resistance and chipping resistance. This is the significance of stacking these layers.

The coating film of the present invention preferably has compressive stress, however, it is not necessary to precisely control compressive stress of each layer as in the conventional technique. This is because, by adopting the structure as will be described in detail below, layers are stacked with high adhesion, without precise control of compressive stress.

The total thickness of such a coating film (total film thickness of stacked layers) is preferably in a range from at least 0.1 μm to at most 25 μm, more preferably the upper limit thereof being not larger than 15 μm and further preferably not larger than 110 μm, and the lower limit thereof being not smaller than 0.5 μm and further preferably not smaller than 1 μm. If the thickness is less than 0.1 μm, an effect of improvement in such characteristics as wear resistance or oxidation resistance may not sufficiently be exhibited. If the thickness exceeds 25 μm, chipping resistance may lower. The coating film will be described further in detail below.

<Hard Layer>

As to the hard layer of the present invention, one or more hard layer is included in the coating film and the hard layer is crystalline in its entirety or crystalline with a part thereof being amorphous. Here, the phrase "crystalline in its entirety" means that substantially the entire layer is crystalline and encompasses also an example where a different phase (impurity phase other than pure crystalline state) is contained only in part depending on a manufacturing condition or the like. On the other hand, the phrase "crystalline with a part being amorphous" refers, for example, to such a structure as nano-composite structure in which crystal particles are dispersed in an amorphous matrix, and to an example where the layer includes a crystalline portion and an amorphous portion. Thus, in summary, the hard layer of the present invention refers to such a layer that at least a part thereof is crystalline, and does not include a layer amorphous in its entirety.

In the present invention, "crystalline" refers to such a state that a compound forming a layer is in a crystalline state, and more specifically refers to such a state that boundary between textures can be recognized through observation with a TEM (transmission electron microscope) and a diffraction pattern of the TEM is not in a shape of a halo pattern. On the other hand, "amorphous" refers to such a state that a compound is present in an amorphous state, and more specifically refers to such a state that a diffraction pattern of the TEM (transmission electron microscope) is in a shape of a halo pattern.

Such a hard layer is preferably composed of a compound containing at least one element selected from the group consisting of IVa-group elements, Va-group elements and VIa-group elements in the periodic table, Al, Mg, and Si, and nitrogen element, or a compound containing at least one element selected from the group consisting of IVa-group elements, Va-group elements and VIa-group elements in the periodic table, Al, Mg, and Si, nitrogen element, and at least one element selected from the group consisting of carbon, oxygen, and boron. Such a hard layer may be composed of one compound or two or more compounds.

The compound forming the hard layer is preferably crystalline, however, the compound may include a nanocomposite structure in which crystal particles (TiN) are dispersed in amorphous matrix (SiN), for example, as expressed as TiSiN, a crystalline compound containing nitrogen element and oxygen element with a part thereof being amorphous, and the like.

Here, examples of compounds containing at least one element selected from the group consisting of IVa-group elements, Va-group elements and VIa-group elements in the periodic table, Al, Mg, and Si, and nitrogen element include TiN, AlN, CrN, TiSiN, ZrN, AlZrN, TiAlN, TiAlSiN, TiAlCrSiN, AlCrN, AlCrSiN, TiZrN, TiAlMoN, TiAlNbN, AlCrTaN, AlTiVN, TiCrHfN, CrSiWN, AlHfN, TiAlWN, ZrSiN, MgN, and the like.

In these chemical formulae, atomic ratio of elements is not necessarily equal and it is assumed that all atomic ratios that have conventionally been known are included. When TiN is given as an example, atomic ratio between Ti and N includes not only 1:1 but also 2:1, 1:0.95, 1:0.9, and the like (to be understood similarly hereinafter, unless otherwise specified).

Meanwhile, examples of compounds containing at least one element selected from the group consisting of IVa-group elements, Va-group elements and Via-group elements in the periodic table, Al, Mg, and Si, nitrogen element, and at least one element selected from the group consisting of carbon, oxygen, and boron include TiON, TiCN, TiCNO, TiBN, TiCBN, TiAlCN, AlCN, AlCrCN, AlON, CrCN, TiSiCN, TiAlON, ZrCN, AlZrON, CrSiBON, AlCrMoCN, TiAlBN, TiAlCrSiBCNO, AlCrNO, AlMgNO, AlTiVCN, and the like.

More specifically, a compound expressed in general formula (I) below is preferred as these compounds.

$$M_e(B_aC_bN_cO_d) \quad (I)$$

In general formula (I) above, M represents at least one element selected from the group consisting of IVa-group elements, Va-group elements and Via-group elements in the periodic table, Al, Mg, and Si (where two or more elements are contained, atomic ratio of elements is not limited, provided that the total comes to e), and relation of $e=1$, $a+b+c+d=1$, $0 \leq a \leq 0.2$, $0 \leq b \leq 0.7$, $0.3 \leq c \leq 1$, and $0 \leq d \leq 0.2$ is satisfied.

If c is less than 0.3, hardness of the hard layer is poor and wear resistance may lower. This may be because the compound cannot have the crystal structure the same as that of a compound (nitride) expressed as $M_eN_c$ ($e=c=1$), where M represents at least one element selected from the group consisting of IVa-group elements, Va-group elements and VIa-group elements in the periodic table, Al, Mg, and Si as above. Here, the compound forming the hard layer preferably has the crystal structure the same as that of the compound (nitride) expressed as $M_eN_c$ ($e=c=1$), so that the compound has particularly excellent hardness.

Therefore, the compound containing at least one element selected from the group consisting of IVa-group elements, Va-group elements and VIa-group elements in the periodic table, Al, Mg, and Si, nitrogen element, and at least one element selected from the group consisting of carbon, oxygen, and boron preferably has the crystal structure the same as the crystal structure of the compound containing only at least one element selected from the group consisting of IVa-group elements, Va-group elements and Via-group elements in the periodic table, Al, Mg, and Si and nitrogen element contained in the compound (atomic ratio between the former element and nitrogen element is not limited to 1:1).

It is noted that, in general formula (I) above, a, b and d other than c are not particularly limited, provided that the above-described condition is satisfied.

The thickness of such a hard layer (total thickness, if the hard layer consists of a plurality of layers, i.e., two or more layers) is preferably in a range from at least 0.1 μm to at most 20 μm, and more preferably the upper limit thereof being not larger than 15 μm and further preferably not larger than 10 μm, and the lower limit thereof being not smaller than 0.5 μm and further preferably not smaller than 1 μm. If the thickness is less than 0.1 μm, an effect of improvement in wear resistance may not sufficiently be exhibited. If the thickness exceeds 20 μm, chipping resistance lowers, which may not be preferred.

<Oxygen-Rich Hard Layer>

The oxygen-rich hard layer of the present invention is characterized in that one or more oxygen-rich hard layer is included in the coating film, the oxygen-rich hard layer and the hard layer are stacked, and the oxygen-rich hard layer is amorphous in a region of interface with the hard layer. Thus, by implementing the region of interface with the hard layer as amorphous, adhesion with the hard layer different in chemical composition and crystal structure is drastically improved and occurrence of separation from the hard layer can very effectively be prevented. Synergistic effect of the oxygen-rich hard layer and the hard layer thus brings about both high wear resistance and chipping resistance. Thus, the present invention attains a noticeable effect that adhesion between layers can be improved without precise control of compressive stress of each layer as in the conventional technique, and solves the problem that achievement of both wear resistance and chipping resistance is impeded by control of compressive stress.

It is noted that the oxygen-rich hard layer is named as such, because the compound forming this layer contains at least oxygen element (more preferably, content of oxygen element therein is higher than in the compound forming the hard layer).

In addition, the oxygen-rich hard layer is preferably crystalline in a region other than the region of interface. Thus, lowering in hardness of the oxygen-rich hard layer can be prevented while maintaining adhesion with the hard layer, and therefore lowering in wear resistance of the oxygen-rich hard layer itself can be prevented.

Moreover, the region of interface is preferably formed to a thickness in a range from at least 1 nm to at most 500 nm from the interface with the hard layer. If the thickness is less than 1 nm, the amorphous state cannot be stabilized. On the other hand, if the thickness exceeds 500 nm, hardness of the entire layer may lower. The region of interface has a thickness of which lower limit is more preferably not smaller than 50 nm and further preferably not smaller than 100 nm.

If there are a plurality of interface regions (that is, interfaces between the hard layer and the oxygen-rich hard layer) in the coating film of the present invention, the oxygen-rich hard layer is preferably amorphous in all interface regions. If any one or more interface region is crystalline instead of amorphous, however, it does not depart from the scope of the present invention.

Preferably, the oxygen-rich hard layer is composed of a compound containing at least one element selected from the group consisting of IVa-group elements, Va-group elements and VIa-group elements in the periodic table, Al, Y, Mg, B, and Si and oxygen element, or a compound containing at least one element selected from the group consisting of IVa-group elements, Va-group elements and VIa-group elements in the periodic table, Al, Y, Mg, B, and Si, oxygen element, and at least one element selected from the group consisting of carbon, nitrogen and boron. Such an oxygen-rich hard layer can be composed of one compound or two or more compounds.

Here, examples of the compounds containing at least one element selected from the group consisting of IVa-group elements, Va-group elements and Via-group elements in the periodic table, Al, Y, Mg, B, and Si, and oxygen element include $Al_2O_3$, $Y_2O_3$, MgO, $SiO_2$, $Cr_2O_3$, $Ti_2O_3$, $TiO_2$, AlBON, $V_2O_5$, $ZrO_2$, $HfO_2$, $Ta_2O_5$, $Nb_2O_5$, $WO_3$, and the like.

In addition, examples of the compounds containing at least one element selected from the group consisting of IVa-group elements, Va-group elements and VIa-group elements in the periodic table, Al, Y, Mg, B, and Si, oxygen element, and at least one element selected from the group consisting of carbon, nitrogen and boron include TiON, TiCNO, AlON, TiAlON, AlZrON, CrSiBON, TiAlCrSiBCNO, ZrSiON, AlYON, AlMgON, AlVON, and the like.

More specifically, a compound expressed in general formula (II) below is preferred as these compounds.

$$M'_w(B_sC_tN_uO_v) \tag{II}$$

In general formula (II) above, M' represents at least one element selected from the group consisting of IVa-group elements, Va-group elements and VIa-group elements in the periodic table, Al, Y, Mg, B, and Si (where two or more elements are contained, atomic ratio of elements is not limited, provided that the total comes to w), and relation of w=1, $s+t+u+v=1.5$, $0 \leq s+t+u < 0.7$, and $0.8 \leq v \leq 1.5$ is satisfied.

If v above is less than 0.8, the entire layer tends to be amorphous and poor in hardness, which results in lowering in wear resistance. It is noted that, in general formula (II) above, s, t and u other than v are not particularly limited, provided that the above-described condition is satisfied.

Meanwhile, preferably, the compound containing at least one element selected from the group consisting of IVa-group elements, Va-group elements and VIa-group elements in the periodic table, Al, Y, Mg, B, and Si, oxygen element, and at least one element selected from the group consisting of carbon, nitrogen and boron has a crystal structure identical to a crystal structure of a compound containing only at least one element selected from the group consisting of IVa-group elements, Va-group elements and Via-group elements in the periodic table, Al, Y, Mg, B, and Si and oxygen element contained in the compound, in a region other than the region of interface. This is because high hardness can be obtained, which contributes to improvement in wear resistance.

This may be because, where M' represents at least one element selected from the group consisting of IVa-group elements, Va-group elements and Via-group elements in the periodic table, Al, Y, Mg, B, and Si as in general formula (II) as above, hardness is highest when the compound has the crystal structure the same as that of the compound (oxide) expressed as $M'_wO_v$ (w=1, v=1.5). Namely, the compound forming the oxygen-rich hard layer preferably has the crystal structure the same as that of the compound (oxide) expressed as $M'_wO_v$ (w=1, v=1.5), so that the compound has particularly excellent hardness.

The compound forming the oxygen-rich hard layer as above particularly preferably contains Al, and more preferably further contains at least one element selected from the group consisting of Zr, Hf, B, Ti, Cr, Y, and Si, together with Al. Particularly high hardness can be obtained by containing Al and crystal texture becomes smaller by further containing at least one element selected from the group consisting of Zr, Hf, B, Ti, Cr, Y, and Si, so that further higher hardness can be obtained. Therefore, $Al_2O_3$ is particularly preferred as the compound forming the oxygen-rich hard layer (an oxide simultaneously improves also oxidation resistance), and further preferably $Al_2O_3$ further contains at least one element selected from the group consisting of Zr, Hf, B, Ti, Cr, Y, and Si.

A manner in which at least one element selected from the group consisting of Zr, Hf, B, Ti, Cr, Y, and Si is contained in the compound is not particularly limited. Any of an example where the element is contained at a normal position in a crystal lattice of the compound to implement a substitution compound, an example where the element is contained in the crystal lattice to implement an interstitial compound, an example where the element forms an intermetallic compound, an example where the element is present as amorphous, and the like is encompassed. Preferably, the content in the compound of such at least one element selected from the group consisting of Zr, Hf, B, Ti, Cr, Y, and Si is not lower than 0.01 atomic % and not higher than 10 atomic %, and more preferably, the lower limit thereof being not lower than 0.5 atomic %. If the content is less than 0.01 atomic %, an effect of improvement in hardness may not sufficiently be exhibited. If the content exceeds 10 atomic %, crystallinity in the region other than the amorphous region is lowered and hardness may lower, which is not preferred.

Where $Al_2O_3$ contains at least one element selected from the group consisting of Zr, Hf, B, Ti, Cr, Y, and Si, the crystal structure in that case is preferably the same as the crystal structure of a case where that element is not contained.

The thickness of such an oxygen-rich hard layer (total thickness, if the oxygen-rich hard layer consists of a plurality of layers, i.e., two or more layers) is preferably in a range from at least 0.1 μm to at most 20 μm, and more preferably the upper limit thereof being not larger than 10 μm and the lower limit thereof being not smaller than 0.5 μm. If the thickness is less than 0.1 μm, an effect of improvement in wear resistance or oxidation resistance may not sufficiently be exhibited. If the thickness exceeds 20 μm, chipping resistance lowers, which is not preferred.

<Manner of Stacking Coating Film>

A manner of stacking the hard layer and the oxygen-rich hard layer is not particularly limited, and stacking may be performed in any fashion. For example, a layer formed directly on the base material in a manner in contact with the same may be a hard layer or an oxygen-rich hard layer. In addition, when two or more layers are stacked, a layer of a different type may alternately be stacked one by one, or two or more layers of the same type may be stacked successively. Further, a layer forming a surface as an uppermost layer of the coating film may also be implemented by any of the hard layer and the oxygen-rich hard layer. Moreover, as described above, a layer other than the hard layer and the oxygen-rich hard layer may be included.

<Manufacturing Method>

A method of manufacturing the surface-coated cutting tool according to the present invention includes a method of forming each layer in the coating film on the base material with a physical vapor deposition method or a chemical vapor deposition method. The chemical vapor deposition method tends to apply tensile stress to the coating film and may lead to poor resistance to shock. Therefore, each layer in the coating film is particularly preferably formed with the physical vapor deposition method.

Here, any conventionally known physical vapor deposition method may be adopted as the physical vapor deposition method. For coating with a non-conductive compound (such as $Al_2O_3$), however, a sputtering method is preferred. Among others, a magnetron sputtering method using a pulse power supply as a cathode is preferably adopted. In addition, combination of a sputtering method and an arc ion plating method, or a film formation method with arc ion plating by dispersing a conductive substance in a non-conductive compound to provide conductivity, may also be adopted.

Here, conditions for forming the region of interface with the hard layer as amorphous in the oxygen-rich hard layer are as follows. Specifically, in an example where the magnetron sputtering method using a pulse power supply as a cathode (reactive sputtering method) is adopted, for example, a bias voltage is not applied, a substrate (base material) is set to a temperature equal to that for achieving crystalline state, a flow rate of oxygen gas is set to 50% or less of a flow rate for obtaining a crystalline compound, and in addition, a discharge voltage is controlled such that a pulse DC power value is set to 35% or less of the power value for obtaining a crystalline compound. The amorphous region can thus be obtained.

EXAMPLES

In the following, the present invention will be described in further detail with reference to examples, however, the present invention is not limited thereto. Chemical composition of each coating film below (composition of compounds) was confirmed with an XPS (X-ray photoelectron spectroscopy apparatus) and identification as crystalline and amorphous was confirmed with a TEM. In addition, the residual stress (compressive stress) was calculated by finding an average value of any 3 points in a flat portion of the surface of the cutting tool with a $\sin^2\psi$ method using an X-ray stress measurement apparatus (these points were selected at a distance from each other by at least 0.5 mm, in order to represent the stress in that region) (the $\sin^2\psi$ method using an X-ray is widely used as a method of measuring residual stress in a polycrystalline material, and described in detail, for example, on pages 54-67 of "X-ray Stress Measurement" (The Society of Materials Science, Japan, 1981, published by Yokendo Co., Ltd.)).

In addition, in the following, each layer in the coating film is formed with combination of an unbalanced magnetron sputtering method and a cathode arc ion plating method representing physical vapor deposition methods, however, the present invention encompasses an example where each layer in the coating film is formed with other known physical vapor deposition methods.

<Fabrication of Surface-Coated Cutting Tool>

The following two types were prepared as the base material. Specifically, a base material made of WC-based cemented carbide under JIS M20 grade and having a shape as the cutting insert under JIS CNMG 120408 (to be used in two types of wear resistance tests which will be described later) and a base material made of WC-based cemented carbide under JIS P20 grade and having a shape as the cutting insert under JIS SDEX 42MT (to be used in an interrupted test which will be described later) were prepared (aforementioned JIS is of 1998 version). Then, the coating film was formed on each base material with the following method in a similar manner.

Figure 1:
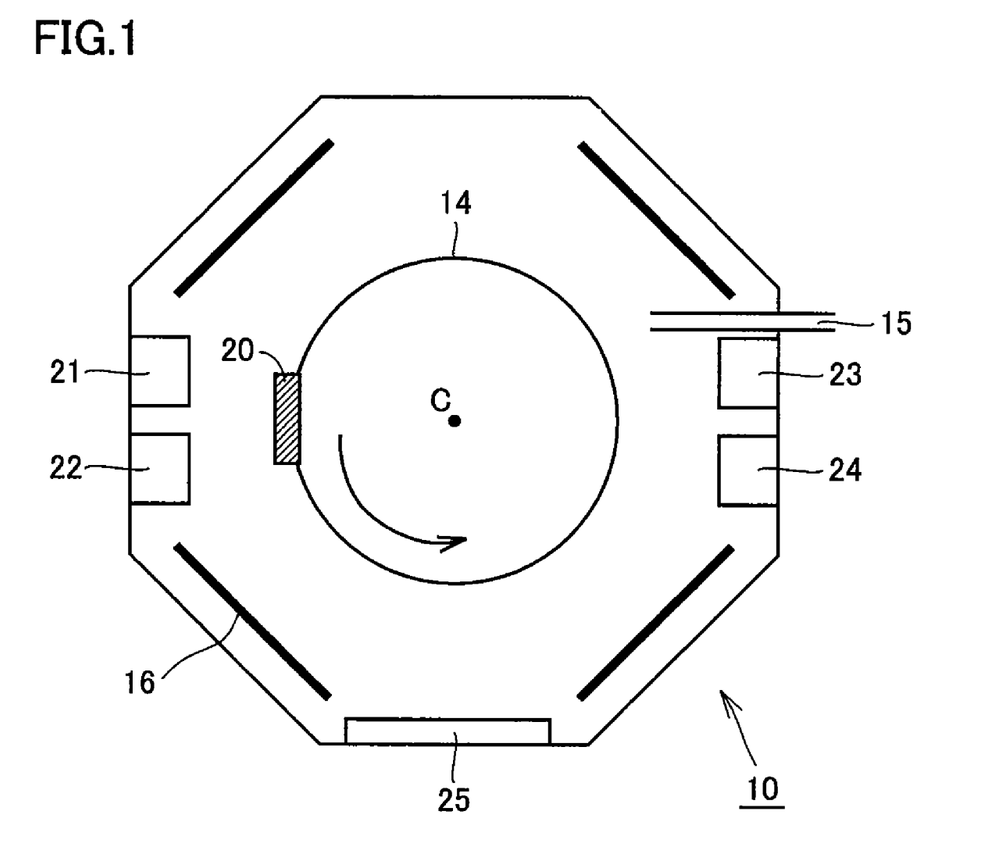
FIG. 1 is a schematic diagram showing an overall structure of a film forming apparatus.

Specifically, initially, the base material was attached to an unbalanced magnetron sputtering apparatus (a film forming apparatus) including a pulse DC power supply as a cathode. FIG. 1 is a schematic diagram showing an overall structure of a film forming apparatus 10. A plurality of arc evaporation sources 21, 22, 23, and 24 and an unbalanced magnetron sputtering evaporation source (hereinafter, called a UBM sputtering source) 25 were arranged in film forming apparatus 10 shown in FIG. 1, and a base material 20 was attached to a holder 14 that rotates around a central point C in a manner opposed to each of evaporation sources 21 to 25. A necessary gas is introduced from a gas inlet port 15 into film forming apparatus 10. In addition, a heater 16 is provided in film forming apparatus 10.

In the present example, a prescribed metal raw material (such as TiAl or Ti) is set at one or more of arc evaporation sources 21, 22, 23, and 24, and for example, Al (Zr, Hf, B, Ti, Cr, Y, Si, and the like may also be included) is set at UBM sputtering source 25. Namely, as the coating film on the base material, the oxygen-rich hard layer is formed using the UBM sputtering source and the hard layer is formed using the arc evaporation source.

Then, the pressure in the apparatus was reduced to $1\times10^{-3}$ Pa or lower by means of a vacuum pump and the temperature of base material 20 was raised to 650° C. with heater 16 provided in the apparatus and held for 1 hour.

Thereafter, while argon gas was introduced, the pressure in the apparatus was held at 3.0 Pa, and the voltage of a substrate bias power supply was gradually raised to −1000V, cleaning of the surface of the base material was performed for 15 minutes. Thereafter, the argon gas was exhausted.

Thereafter, each target as above was set in the evaporation source such that the chemical composition and the feature of the stack structure (film thickness and compressive stress) of the coating film formed on the surface of the base material are as shown in Tables 1 and 2 below. The oxygen-rich hard layers in tools labeled as Nos. 1 to 18 were formed with the reactive sputtering method, while the temperature of the base material (substrate) was set to 500 to 800° C., oxygen gas was fed together with the argon gas, and pulse DC power was applied to the UBM sputtering source.

Here, at initial and/or late stage of film formation, a bias voltage was not applied, a flow rate of the oxygen gas was set to 50% or lower of the flow rate at the time other than the initial and/or late stage of film formation (namely, a condition for obtaining a crystalline compound), and in addition, a discharge voltage was controlled such that the pulse DC power value was set to 35% or lower of the power value at the time other than the initial and/or late stage of film formation, so that the region of interface with the hard layer was formed as amorphous and the region other than the interface region was formed as crystalline.

In addition, the hard layer was formed with the arc ion plating method while the temperature of the base material (substrate) was set to 400 to 600° C. and vacuum was set or at least one gas of nitrogen, methane (serving as a source of carbon) and oxygen was introduced as the reaction gas.

In Tables 1 and 2, it is assumed that, as the coating film, the first layer is formed directly above the base material and the second layer and so on are successively formed on the first layer. The blank field indicates that the layer is not formed. In addition, in the example, a compound with asterisk "*" in the field of the compound indicates the oxygen-rich hard layer and others indicate the hard layer. In the field of the oxygen-rich hard layer, "amo" indicates being amorphous and a numeric value (nm) in parentheses indicates a thickness of the amorphous region (namely, a thickness of the region of interface with the hard layer). In addition, "α" or "γ" indicates being crystalline ("α" indicates an α-type crystal structure, "γ" indicates a γ-type crystal structure, and "α, γ" indicates coexistence of the α-type crystal structure and the γ-type crystal structure).

For example, as to the oxygen-rich hard layer serving as the third layer and labeled as No. 1 in Table 1, the compound forming that layer is $Al_2O_3$. Denotation "amo(80)-γ-amo (200)" indicates that amorphous $Al_2O_3$ is formed at the region of interface with the hard layer (TiAlN) serving as the second layer to a thickness of 80 nm (thickness from the interface with the hard layer is 80 nm), that amorphous $Al_2O_3$ is formed at the region of interface with the hard layer (TiCN) serving as the fourth layer to a thickness of 200 nm (thickness from the interface with the hard layer is 200 nm), and that crystalline (γ-type crystal structure) $Al_2O_3$ is formed to a thickness of 1.22 μm (remaining thickness calculated by subtracting the total thickness (80 nm+200 nm) of the amorphous region from 1.5 μm representing the total thickness of the oxygen-rich hard layer) in the region other than these interface regions (that is, the central region in the direction of thickness).

On the other hand, the hard layer denoted with "amo" indicates that the hard layer is crystalline with a part thereof being amorphous (composed of a crystalline compound with a part thereof being amorphous) (as to "amo-TiSiN" labeled as No. 9 in Table 1, a nanocomposite structure in which crystal particles (TiN) are dispersed in amorphous matrix (SiN) is indicated), and the hard layer without the denotation "amo" indicates that the layer is crystalline in its entirety (composed of a crystalline compound).

In addition, in Tables 1 and 2, atomic symbol and % indication (showing atomic %) shown in parentheses for the oxygen-rich hard layer indicate that that element is contained in the compound forming the oxygen-rich hard layer, by an amount shown with that % indication. Specifically in the case of the third layer labeled as No. 3, for example, it is indicated that $Al_2O_3$ contains 8 atomic % Hf. It has been confirmed that, even if other elements are contained in such a manner, the crystal structure of the crystalline region is the same as the crystal structure of $Al_2O_3$.

Moreover, in Table 1, $Al_2(NO)_3$ forming the oxygen-rich hard layer serving as the first layer and labeled as No. 6 contains a compound expressed as s=0, t=0, u=0.1, and v=1.4 based on general formula (II) above (namely, expressed with conversion to w=1 and s+t+u+v=1.5). In addition, $Al_2(BCO)_3$ forming the oxygen-rich hard layer serving as the third layer and labeled as No. 8 contains a compound expressed as s=0.05, t=0.1, u=0, and v=1.35 based on the expression the same as above. It is noted that $Al_2(NO)_3$ and $Al_2(BCO)_3$ have the γ-type crystal structure the same as that of $Al_2O_3$, in the region other than the amorphous region.

In addition, a conventionally known composition is adopted as the composition for the compound forming the hard layer in Tables 1 and 2, and it was confirmed that the crystal structure thereof is the same as the crystal structure of a compound containing only at least one element selected from the group consisting of IVa-group elements, Va-group elements and VIa-group elements in the periodic table, Al, Mg, and Si, and nitrogen element contained in that compound (here, the crystalline compound).

In the oxygen-rich hard layers serving as the third layer and labeled as No. 8 and No. 9 in Table 1, as the amorphous region is not formed in the region of interface with TiN in the fourth layer, TiN in the fourth layer may also be considered not as the hard layer but as another layer. Similarly, in the oxygen-rich hard layers serving as the second layer and labeled as No. 10 and No. 11, as the amorphous region is not formed in the region of interface with TiN in the first layer, TiN in the first layer may also be considered not as the hard layer but as another layer.

Thus, surface-coated cutting tools labeled as Nos. 1 to 23 and having the coating film on the base material shown in Tables 1 and 2 were fabricated. Nos. 1 to 18 represent the examples of the present invention, while Nos. 19 to 23 represent the comparative examples.

It is noted that, among the coating films in the comparative examples, a layer corresponding to the hard layer in the examples (the layer without denotation "amo" or "α") was formed under the conditions the same as in the examples. In addition, a layer in the comparative examples with denotation "amo" or "α", as in the case of the oxygen-rich hard layer in the examples, was formed by applying the conditions similar to those for forming the oxygen-rich hard layer in the examples above, in correspondence with each denotation. The denotation itself in the comparative examples is the same as in the examples. For example, denotation "γ-amo(220)-γ" for the second layer labeled as No. 22 indicates that crystalline (γ-type crystal structure) $Al_2O_3$ was formed in the region of interface with TiN in the first layer, crystalline $Al_2O_3$ was also formed in the region of interface with TiSiBCNO in the third layer, and amorphous $Al_2O_3$ was formed to a thickness of 220 nm in the region other than these interface regions (that is, the central region in the direction of thickness), and denotation "(B 2%)" indicates that $Al_2O_3$ contains 2 atomic % B.

TABLE 1

| | | First Layer | | Second Layer | | Third Layer | | Fourth Layer | |
|---|---|---|---|---|---|---|---|---|---|
| No. | | Compound | Film Thickness/ Stress (μm/GPa) | Compound | Film Thickness/ Stress (μm/GPa) | Compound | Film Thickness/ Stress (μm/GPa) | Compound | Film Thickness/ Stress (μm/GPa) |
| Example | 1 | TiN | 0.5/−1.0 | TiAlN | 1.5/−2.7 | * $Al_2O_3$ amo(80)-γ-amo(200) | 1.5/−1.6 | TiCN | 0.8/−0.5 |
| | 2 | TiN | 0.5/−1.0 | TiAlN | 1.5/−3.1 | * $Al_2O_3$ amo(300)-γ | 1.5/−2.3 | — | — |
| | 3 | TiN | 0.5/−1.0 | TiAlN | 1.5/−2.5 | * $Al_2O_3$(Hf 8%) amo(730)-γ | 1.5/−2.0 | — | — |
| | 4 | TiN | 0.5/−1.0 | * $Al_2O_3$ amo(80)-α, γ-amo(470) | 1.5/−0.7 | AlCrN | 2.5/−3.1 | — | — |
| | 5 | TiN | 0.5/−1.0 | * $Al_2O_3$ amo(80)-α, γ-amo(470) | 1.5/−0.7 | AlCrN | 5.6/−2.8 | — | — |
| | 6 | * $Al_2(NO)_3$ γ-amo(130) | 0.5/−0.7 | amo-AlCrNO | 1.5/−2.7 | * $Al_2O_3$ amo(220)-α, γ-amo(160) | 1.5/−3.4 | TiAlSiN | 1.0/−2.2 |
| | 7 | * $Al_2O_3$ γ-amo(650) | 1.5/−3.3 | amo-AlCrNO | 1.5/−2.7 | * $Al_2O_3$ amo(120)-α, γ-amo(40) | 1.5/−2.1 | TiAlSiN | 1.0/−3.4 |
| | 8 | TiN | 0.5/−1.0 | TiAlCN | 1.5/−2.6 | * $Al_2(BCO)_3$ | 1.5/−2.6 | TiN | 0.5/−1.0 |

TABLE 1-continued

| | No. | First Layer Compound | First Layer Film Thickness/Stress (μm/GPa) | Second Layer Compound | Second Layer Film Thickness/Stress (μm/GPa) | Third Layer Compound | Third Layer Film Thickness/Stress (μm/GPa) | Fourth Layer Compound | Fourth Layer Film Thickness/Stress (μm/GPa) |
|---|---|---|---|---|---|---|---|---|---|
| | 9 | TiN | 0.5/−1.0 | amo-TiSiN | 1.5/−2.0 | * $Al_2O_3$(Ti 4%) amo(150)-γ amo-γ(480) | 2.5/−1.1 | TiN | 0.5/−1.0 |
| | 10 | TiN | 0.5/−1.0 | * $Al_2O_3$(Cr 8%) γ-amo(200) | 1.5/−1.5 | TiSiBCN | 1.0/−4.6 | — | — |
| | 11 | TiN | 0.5/−1.0 | * $Al_2O_3$(Zr 2%) γ-amo(610) | 1.5/−0.7 | TiSiBCN | 1.5/−4.6 | — | — |
| | 12 | * $Al_2O_3$ γ-amo(170) | 2.0/−2.1 | AlCrSiBNO | 1.5/−1.4 | TiAlNO | 1.5/−2 | TiCN | 1.0/−1.5 |

Feed: 0.3 mm/rev.

TABLE 2

| | No. | First Layer Compound | First Layer Film Thickness/Stress (μm/GPa) | Second Layer Compound | Second Layer Film Thickness/Stress (μm/GPa) | Third Layer Compound | Third Layer Film Thickness/Stress (μm/GPa) | Fourth Layer Compound | Fourth Layer Film Thickness/Stress (μm/GPa) |
|---|---|---|---|---|---|---|---|---|---|
| Example | 13 | TiAlBN | 1.0/−2.3 | * $Al_2O_3$ amo(170)-γ-amo(290) | 1.0/−1.8 | AlCrN | 2.0/−2.8 | — | — |
| | 14 | TiAlN | 0.5/−4.0 | * $Al_2O_3$ amo(960)-γ-amo(670) | 2.5/−0.8 | AlCrSiCNO | 0.5/−2.9 | AlCrN | 2.5/−2.7 |
| | 15 | AlN | 0.5/−1.0 | * $Al_2O_3$ amo(50)-γ-amo(550) | 1.5/−1.9 | TiSiBCNO | 1.0/−1.4 | TiAlSiN | 1.0/−3.3 |
| | 16 | TiN | 0.5/−1.0 | * $Al_2O_3$(B 2%) amo(180)-γ-amo(180) | 1.5/−3.1 | TiSiBCNO | 1.0/−1.4 | TiAlSiN | 1.0/−3.3 |
| | 17 | TiN | 0.5/−1.0 | TiAlN | 1.5/−2.7 | * $Al_2O_3$(Y 15%) amo(150)-γ-amo(280) | 2.5/−1.3 | TiCN | 2.0/−1.5 |
| | 18 | TiN | 0.5/−1.0 | TiAlN | 1.5/−2.7 | * $Al_2O_3$(Si 9%) amo(100)-γ-amo(310) | 3.0/−1.6 | TiCN | 1.5/−1.5 |
| Compartive example | 19 | TiN | 0.5/−1.0 | TiAlN | 1.5/−2.7 | $Al_2O_3$ γ | 1.5/−1.6 | TiCN | 0.8/−0.5 |
| | 20 | TiN | 0.5/−1.0 | TiAlN | 1.5/−2.7 | $Al_2O_3$ amo | 1.5/−2.1 | TiCN | 0.8/−0.5 |
| | 21 | TiN | 0.5/−1.0 | TiAlN | 1.0/−2.7 | $Al_2O_3$ γ-amo(220)-γ | 1.5/−2.5 | TiCN | 0.8/−0.5 |
| | 22 | TiN | 0.5/−1.0 | $Al_2O_3$(B 2%) γ-amo(220)-γ | 1.5/−1.5 | TiSiBCNO | 1.0/−1.4 | TiAlSiN | 1.0/−3.3 |
| | 23 | $Al_2O_3$ γ-amo(130)-γ | 0.5/−2.4 | AlCrNO | 1.5/−2.7 | $Al_2O_3$ amo | 1.5/−0.9 | TiAlSiN | 1.0/−2.2 |

As a cutting test, these surface-coated cutting tools were subjected to a wear resistance test (two types) and an interrupted test under the conditions below. The results are as shown in Table 3 below. In the wear resistance test, a period of time until a flank face wear amount attains to 0.15 mm was measured and a longer time indicates better wear resistance. In addition, in the interrupted test, a period of time until the tool is broken was measured and a longer time indicates better chipping resistance.

<Wear Resistance Test-1>
Work material: SCM435 round rod
Cutting speed: 250 m/min
Depth of cut: 2.0 mm
Feed: 0.3 mm/rev.
Dry/Wet: Dry <Wear Resistance Test-2>
Work material: FCD450 round rod
Cutting speed: 260 m/min
Depth of cut: 2.0 mm
Feed: 0.3 mm/rev.
Dry/Wet: Dry <Interrupted Cutting Test>
Work material: SCM435
Cutting speed: 380 m/min
Depth of cut: 2.0 mm
Feed: 0.2 mm/rev.
Dry/Wet: Dry

TABLE 3

| | No. | Wear resistance test - 1 | Wear resistance test - 2 | Interrupted test |
|---|---|---|---|---|
| Example | 1 | 14 minutes 7 seconds | 11 minutes 22 seconds | 8 minutes 37 seconds |
| | 2 | 16 minutes 39 seconds | 13 minutes 44 seconds | 10 minutes 3 seconds |
| | 3 | 13 minutes 30 seconds | 10 minutes 31 seconds | 7 minutes 14 seconds |

TABLE 3-continued

| No. | | Wear resistance test - 1 | Wear resistance test - 2 | Interrupted test |
|---|---|---|---|---|
| | 4 | 14 minutes 28 seconds | 12 minutes 14 seconds | 8 minutes 22 seconds |
| | 5 | 14 minutes 31 seconds | 11 minutes 52 seconds | 8 minutes 12 seconds |
| | 6 | 16 minutes 23 seconds | 12 minutes 2 seconds | 11 minutes 51 seconds |
| | 7 | 14 minutes 56 seconds | 10 minutes 12 seconds | 8 minutes 6 seconds |
| | 8 | 16 minutes 58 seconds | 12 minutes 32 seconds | 10 minutes 46 seconds |
| | 9 | 15 minutes 35 seconds | 13 minutes 12 seconds | 9 minutes 40 seconds |
| | 10 | 17 minutes 44 seconds | 12 minutes 46 seconds | 12 minutes 30 seconds |
| | 11 | 14 minutes 40 seconds | 11 minutes 47 seconds | 8 minutes 45 seconds |
| | 12 | 16 minutes 36 seconds | 13 minutes 7 seconds | 10 minutes 38 seconds |
| | 13 | 16 minutes 53 seconds | 13 minutes 51 seconds | 10 minutes 33 seconds |
| | 14 | 12 minutes 22 seconds | 8 minutes 6 seconds | 6 minutes 11 seconds |
| | 15 | 12 minutes 49 seconds | 8 minutes 15 seconds | 6 minutes 29 seconds |
| | 16 | 17 minutes 9 seconds | 13 minutes 48 seconds | 12 minutes 21 seconds |
| | 17 | 17 minutes 13 seconds | 12 minutes 43 seconds | 12 minutes 56 seconds |
| | 18 | 15 minutes 52 seconds | 11 minutes 15 seconds | 9 minutes 57 seconds |
| Comparative Example | 19 | 5 minutes 2 seconds | 6 minutes 44 seconds | 4 minutes 32 seconds |
| | 20 | 6 minutes 7 seconds | 4 minutes 23 seconds | 3 minutes 51 seconds |
| | 21 | 3 minutes 31 seconds | 1 minute 10 seconds | 2 minutes 12 seconds |
| | 22 | 4 minutes 24 seconds | 2 minutes 41 seconds | 1 minute 49 seconds |
| | 23 | 7 minutes 16 seconds | 6 minutes 44 seconds | 5 minutes 24 seconds |

As can clearly be seen from Table 3 above, all of the surface-coated cutting tools in the examples of the present invention labeled as Nos. 1 to 18 had excellent wear resistance and chipping resistance. Namely, it is considered that, in the surface-coated cutting tools in these examples, as the layers forming the coating film are excellent in adhesion with each other, synergistic effect of the layers was exhibited and both of high wear resistance and chipping resistance were achieved.

In contrast, the surface-coated cutting tools in the comparative examples labeled as Nos. 19 to 23 were poorer in adhesion than those in the examples above and they were also poorer in wear resistance and chipping resistance. Therefore, it could be confirmed that the surface-coated cutting tool according to the present invention was superior.

Though a base material having a chip breaker is employed as the base material in the present examples, however, an effect the same as in the present examples can be obtained also in a base material without a chip breaker or a cutting tool (insert) of which entire upper and lower surfaces are ground.

As described above, embodiments and examples of the present invention have been described, however, combination as appropriate of embodiments and examples described above are originally encompassed.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A surface-coated cutting tool, comprising:
a base material; and
a coating film formed on the base material;
said coating film including one or more hard layer and one or more oxygen-rich hard layer;
said hard layer being crystalline in its entirety or crystalline with a part being amorphous; and
said oxygen-rich hard layer and said hard layer being stacked and said oxygen-rich hard layer being amorphous in a region of interface with said hard layer wherein said oxygen-rich hard layer is crystalline in a region other than said region of interface.

2. The surface-coated cutting tool according to claim 1, wherein
said region of interface is formed to a thickness from at least 1 nm to at most 500 nm from the interface with said hard layer.

3. The surface-coated cutting tool according to claim 1, wherein
said hard layer is composed of
a compound containing
at least one element selected from the group consisting of IVa-group elements, Va-group elements and VIa-group elements in a periodic table, Al, Mg, and Si, and
nitrogen element, or
a compound containing
at least one element selected from the group consisting of IVa-group elements, Va-group elements and VIa-group elements in a periodic table, Al, Mg, and Si,
nitrogen element, and
at least one element selected from the group consisting of carbon, oxygen, and boron.

4. The surface-coated cutting tool according to claim 3, wherein
said compound containing at least one element selected from the group consisting of IVa-group elements, Va-group elements and VIa-group elements in the periodic table, Al, Mg, and Si, nitrogen element, and at least one element selected from the group consisting of carbon, oxygen, and boron has a crystal structure identical to a crystal structure of a compound containing only at least one element selected from the group consisting of IVa-group elements, Va-group elements and VIa-group elements in the periodic table, Al, Mg, and Si and nitrogen element contained in said compound.

5. The surface-coated cutting tool according to claim 1, wherein
said oxygen-rich hard layer is composed of
a compound containing
at least one element selected from the group consisting of IVa-group elements, Va-group elements and VIa-group elements in a periodic table, Al, Y, Mg, B, and Si, and
oxygen element, or
a compound containing
at least one element selected from the group consisting of IVa-group elements, Va-group elements and VIa-group elements in a periodic table, Al, Y, Mg, B, and Si, oxygen element, and
at least one element selected from the group consisting of carbon, nitrogen, and boron.

6. The surface-coated cutting tool according to claim 5, wherein
said compound containing at least one element selected from the group consisting of IVa-group elements, Va-group elements and VIa-group elements in the periodic table, Al, Y, Mg, B, and Si, oxygen element, and at least one element selected from the group consisting of carbon, nitrogen, and boron has a crystal structure identical to a crystal structure of a compound containing only at least one element selected from the group consisting of IVa-group elements, Va-group elements and VIa-group elements in the periodic table, Al, Y, Mg, B, and Si, and oxygen element contained in said compound, in a region other than said region of interface.

7. The surface-coated cutting tool according to claim 5, wherein
said compound forming said oxygen-rich hard layer contains Al.

8. The surface-coated cutting tool according to claim 5, wherein
said compound forming said oxygen-rich hard layer contains at least one element selected from the group consisting of Zr, Hf, B, Ti, Cr, Y, and Si, together with Al.

9. The surface-coated cutting tool according to claim 1, wherein
said coating film has a thickness from at least 0.1 μm to at most 25 μm.

10. The surface-coated cutting tool according to claim 1, wherein
said base material is formed from any one of cemented carbide, cermet, high-speed steel, ceramics, sintered cubic boron nitride, and sintered diamond.

* * * * *